(12) United States Patent
Canney et al.

(10) Patent No.: US 8,554,390 B2
(45) Date of Patent: Oct. 8, 2013

(54) FREE COOLING SOLUTION FOR A CONTAINERIZED DATA CENTER

(75) Inventors: Brian A. Canney, Jackson, NJ (US); Wally Karrat, Danbury, CT (US); Bret W. Lehman, Raleigh, NC (US); Christopher L. Molloy, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 347 days.

(21) Appl. No.: 12/946,925

(22) Filed: Nov. 16, 2010

(65) Prior Publication Data

US 2012/0123607 A1 May 17, 2012

(51) Int. Cl.
| | |
|---|---|
| G05D 23/00 | (2006.01) |
| G06F 17/00 | (2006.01) |
| G06F 1/20 | (2006.01) |
| F28D 15/00 | (2006.01) |
| F28F 7/00 | (2006.01) |
| H05K 7/20 | (2006.01) |
| G05B 19/042 | (2006.01) |
| H01L 23/427 | (2006.01) |

(52) U.S. Cl.
CPC ............ *G06F 1/206* (2013.01); *G05B 19/0426* (2013.01); *H01L 23/427* (2013.01); *H05K 7/20745* (2013.01)
USPC ..................... 700/300; 165/104.33; 165/80.3; 361/696; 361/679.47; 361/699

(58) Field of Classification Search
USPC ..................... 700/300, 90; 165/104.33, 80.3; 454/118
See application file for complete search history.

(56) References Cited

U.S. PATENT DOCUMENTS

| | | | |
|---|---|---|---|
| 4,535,386 A | | 8/1985 | Frey, Jr. et al. |
| 4,590,538 A | * | 5/1986 | Cray, Jr. ......................... 361/700 |
| 4,997,034 A | * | 3/1991 | Steffen et al. ............. 165/104.34 |
| 5,406,807 A | * | 4/1995 | Ashiwake et al. ............... 62/376 |
| 6,305,180 B1 | | 10/2001 | Miller et al. |
| 6,421,240 B1 | | 7/2002 | Patel |
| 6,450,250 B2 | | 9/2002 | Guerrero |
| 6,687,126 B2 | | 2/2004 | Patel et al. |

(Continued)

FOREIGN PATENT DOCUMENTS

JP 58106394 A 6/1983

OTHER PUBLICATIONS

IBM Corporation, "IBM Rear Door Heat eXchanger for the iDataPlex Rack-Installation and Maintenance Guide", Mar. 2009, Part No. 49Y2134.*

(Continued)

*Primary Examiner* — Mohammad Ali
*Assistant Examiner* — Kelvin Booker
(74) *Attorney, Agent, or Firm* — John R. Pivnichny; Keohane & D'Alessandro, PLLC

(57) ABSTRACT

A heat exchanger system having an IT container having an inner chamber containing the media from which heat is to be pulled, and further having an outer surface to which is attached corrugated columns of thermally conducting material, cooling water pipes through the corrugated columns supplied with cooling water, at least the outer surface of the container and the corrugated columns is composed of metal and the outer surface of the container is separated from the inner surface by insulator material. It also contains a temperature monitor and controller for controlling the cooling system based upon the environment temperature to save energy.

20 Claims, 5 Drawing Sheets

CROSS SECTION OF CONTAINER SKIN - HEAT EXCHANGER 300

(56) References Cited

U.S. PATENT DOCUMENTS

| | | | |
|---|---|---|---|
| 6,811,651 B2 | 11/2004 | Long | |
| 7,002,799 B2* | 2/2006 | Malone et al. | 361/699 |
| 7,213,349 B1 | 5/2007 | Brunner | |
| 7,222,660 B2 | 5/2007 | Giacoma et al. | |
| 7,323,043 B2* | 1/2008 | Finamore | 96/146 |
| 7,392,836 B2 | 7/2008 | Wong | |
| 7,497,252 B2 | 3/2009 | Pun | |
| 7,511,960 B2* | 3/2009 | Hillis et al. | 361/702 |
| 7,551,971 B2* | 6/2009 | Hillis | 700/90 |
| 7,854,652 B2* | 12/2010 | Yates et al. | 454/184 |
| 7,856,838 B2* | 12/2010 | Hillis et al. | 62/259.2 |
| 7,864,527 B1* | 1/2011 | Whitted | 361/696 |
| 7,894,945 B2* | 2/2011 | Hillis | 700/276 |
| 7,971,446 B2* | 7/2011 | Clidaras et al. | 62/259.2 |
| 8,047,904 B2* | 11/2011 | Yates et al. | 454/118 |
| 8,238,082 B2* | 8/2012 | Salpeter | 361/679.02 |
| 8,238,104 B2* | 8/2012 | Salpeter | 361/716 |
| 2005/0231913 A1* | 10/2005 | Malone et al. | 361/698 |
| 2008/0060372 A1* | 3/2008 | Hillis et al. | 62/259.2 |
| 2008/0060790 A1* | 3/2008 | Yates et al. | 165/80.3 |
| 2008/0062647 A1* | 3/2008 | Hillis et al. | 361/699 |
| 2008/0064317 A1* | 3/2008 | Yates et al. | 454/118 |
| 2008/0123288 A1* | 5/2008 | Hillis | 361/687 |
| 2008/0259566 A1 | 10/2008 | Fried | |
| 2009/0183514 A1* | 7/2009 | Holmes et al. | 62/51.1 |
| 2009/0198388 A1* | 8/2009 | Hillis | 700/300 |
| 2009/0223144 A1* | 9/2009 | Leahy | 52/79.1 |
| 2011/0175498 A1* | 7/2011 | Bash et al. | 312/107 |
| 2012/0031585 A1* | 2/2012 | Salpeter | 165/80.3 |
| 2012/0033377 A1* | 2/2012 | Salpeter | 361/679.53 |
| 2012/0075794 A1* | 3/2012 | Wei et al. | 361/679.48 |
| 2012/0155027 A1* | 6/2012 | Broome et al. | 361/696 |
| 2013/0044426 A1* | 2/2013 | Neumann et al. | 361/679.54 |

OTHER PUBLICATIONS

Miller, R., "Video Overview: AST's Free Cooling Module", Aug. 2011, Retrieved from the Internet on May 14, 2013 at "www.datacenterknowledge.com".*

Xu, T., "Performance Evaluation for a Modular, Scalable Passive Cooling System in Data Centers", May 2009, Ernest Orlando lawrence Berkeley Laboratory, LNL-2004E, Environmental Energy Technologies Division.*

Zhang, P. and Hrnjak, P., "Air-Side Performance Evaluation of Three Types of Heat Exchangers in Dry, Wet and Periodic Frosting Conditions", 2006, International Refrigerationa do Air Conditioning Conference, Purdue University, School of Mechanical Engineering.*

* cited by examiner

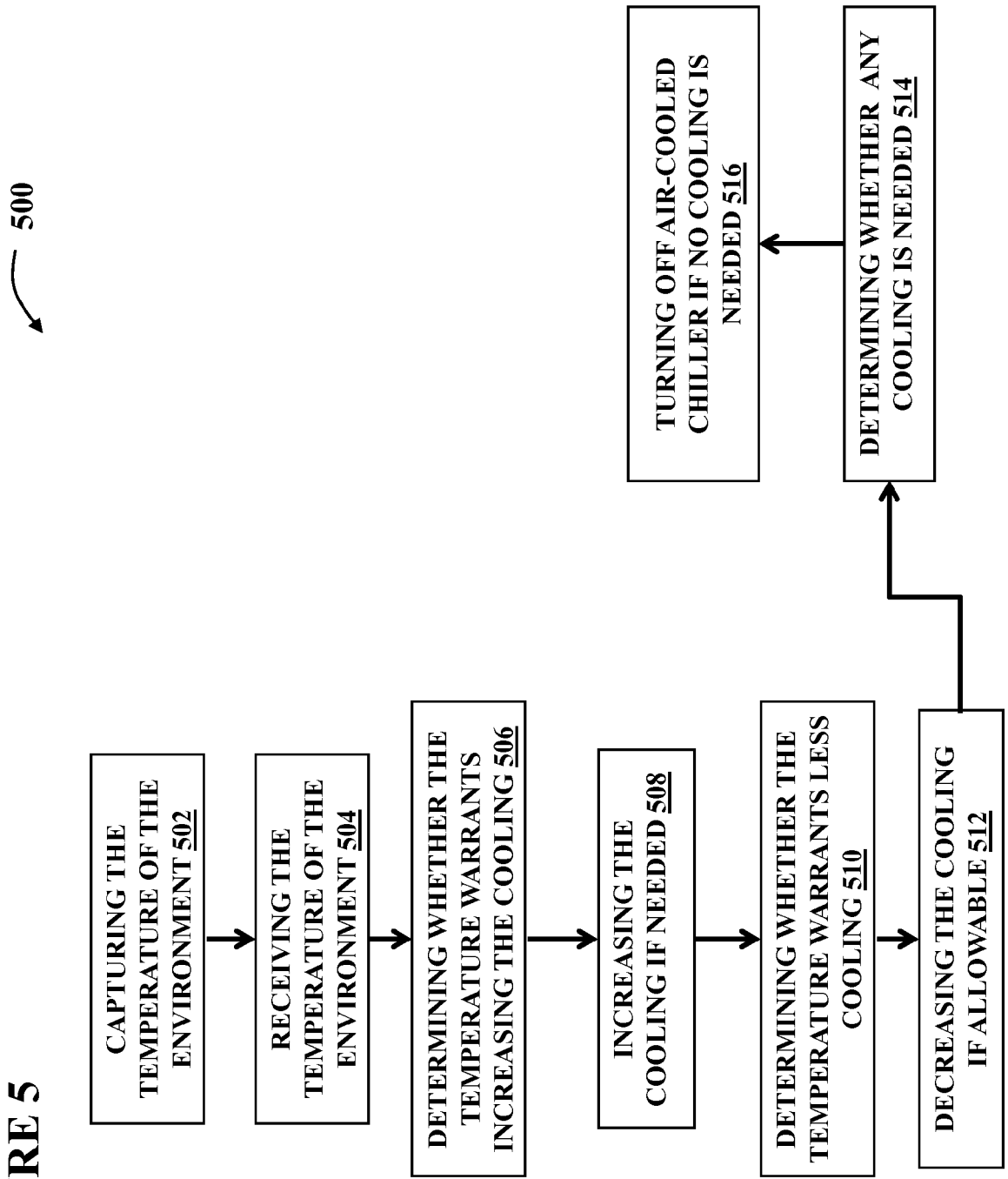

FREE COOLING SOLUTION FOR A CONTAINERIZED DATA CENTER

FIELD OF THE INVENTION

One aspect of the present invention provides for a method and a system for reducing the container data center's dependency on its air-cooled chiller, relying on outside environmental conditions to provide partial or full cooling at times.

There is a need to provide a means of reducing the container data center's dependency on its air-cooled chiller, relying instead on outside environmental conditions to provide partial or full cooling at times.

BACKGROUND OF THE INVENTION

There is a problem in that the cost of operating today's data centers continues to rise and come under closer and closer scrutiny. Containerized data center solutions face challenges in this sense that more traditional data centers do not. They are designed to operate in remote locations and under extreme conditions. As a result, they often need to be supported by air-cooled chillers for cooling that are less efficient than more conventional, water-cooled chillers.

What is needed is a system and method for cooling a containerized data center that are designed to operate in remote locations and under extreme conditions without air-cooled chillers for cooling that are less efficient than more conventional, water-cooled chillers.

Therefore, there exists a need for a solution that solves at least one of the deficiencies of the related art.

SUMMARY OF THE INVENTION

The present invention may comprise a system and method for using the surface area of the container for heat transfer to the outside. A free cooling process, as opposed to the alternative of providing significant power supply to an air-cooled chiller, is described. Finned piping is embedded in the insulation layer, within the corrugated external skin of the container, to facilitate this process. This is novel in the sense that it not only uses the heat transfer characteristics of the metal container, but maximizes the surface area—a critical heat transfer performance parameter—by utilizing the corrugated portions of the container.

The present invention may have a heat exchanger system having a container having an inner chamber containing the media from which heat is to be pulled, and further having an outer surface to which is attached corrugated columns of thermally conducting material, run pipes through the corrugated columns supplied with cooling water, at least the outer surface of the container and the corrugated columns is composed of metal and the outer surface of the container is separated from the inner surface by insulator material.

The present invention may further comprise a heat exchanger system for removing heat from a containerized data center having an IT container comprising one or more cooling items, each having an outer thermal transfer surface having fins for heat exchange, each of the one or more cooling items has a cooling water pipe of thermally conducting material therein, each cooling water pipe has one or more cooling water tubes through the cooling water pipes supplied with cooling water, at least one of the outer surface of the container and the cooling pipes is composed of metal, and the outer surface of the IT container is separated from the inner surface by insulator material.

The present invention may further comprise a method for removing heat from a containerized data center having an IT container comprising capturing the temperature of the environment by a container environment temperature monitor, receiving the temperature of the environment by a container environment temperature processing unit, determining whether the temperature warrants increasing the cooling by the container environment temperature processing unit and increasing the cooling if needed by the container environment temperature processing unit and an air-cooled chiller controller.

The present invention may further comprise a computer-readable medium storing computer instructions, which, when executed, enables a system operating for removing heat from a containerized data center having an IT container, to perform steps comprising capturing the temperature of the environment by a container environment temperature monitor, receiving the temperature of the environment by a container environment temperature processing unit, determining whether the temperature warrants increasing the cooling by the container environment temperature processing unit and increasing the cooling if needed by the container environment temperature processing unit and an air-cooled chiller controller.

The present invention may further comprise a method for deploying a system for removing heat from a containerized data center having an IT container, the method comprising capturing the temperature of the environment by a container environment temperature monitor, receiving the temperature of the environment by a container environment temperature processing unit, determining whether the temperature warrants increasing the cooling by the container environment temperature processing unit and increasing the cooling if needed by the container environment temperature processing unit and an air-cooled chiller controller.

BRIEF DESCRIPTION OF THE DRAWINGS

These and other features of this invention will be more readily understood from the following detailed description of the various aspects of the invention taken in conjunction with the accompanying drawings in which:

FIG. 5 illustrates a method of the present invention for using the surface area of the container for heat transfer to the outside.

The drawings are merely schematic representations, not intended to portray specific parameters of the invention. The drawings are intended to depict only typical embodiments of the invention, and therefore should not be considered as limiting the scope of the invention.

DETAILED DESCRIPTION OF THE DRAWINGS

There is a problem in that that cost of operating today's data centers continues to rise and come under closer and closer scrutiny. Containerized data center solutions face challenges in this sense that more traditional data centers do not. They are designed to operate in remote locations and under extreme conditions. As a result, they often need to be supported by air-cooled chillers for cooling that are less efficient than more conventional, water-cooled chillers.

Figure 1:
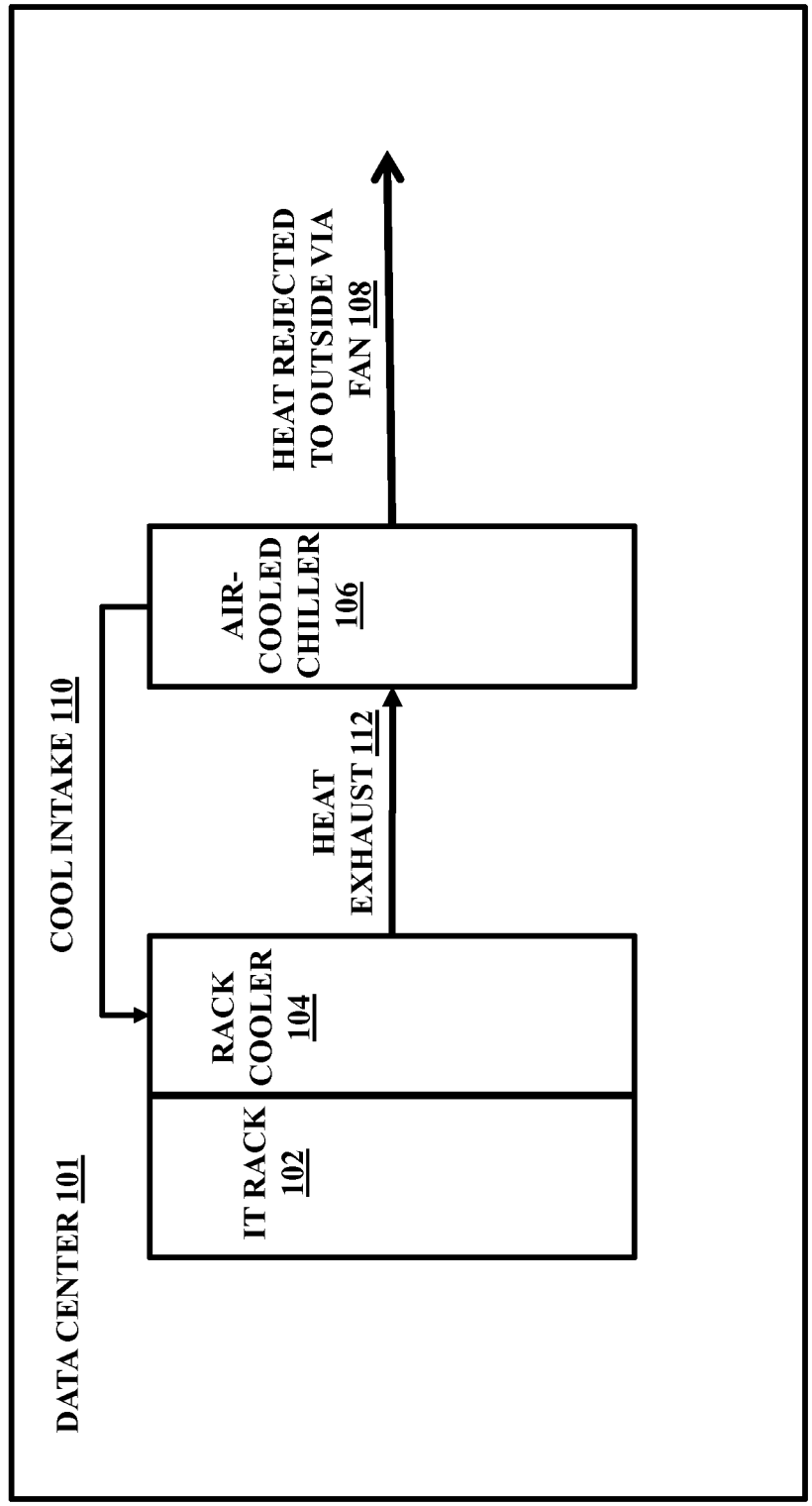
FIG. 1 shows a prior art system for using the surface area of the container for heat transfer to the outside.

FIG. 1 illustrates an example of a prior art Cooling System 100 for cooling Data Center 101 having IT Rack 102 attached to Rack Cooler 104. This prior art Cooling System 100 has the problems noted above and solved by the system of the present invention. Air-Chilled Cooler 106 provides Cool Intake 110 for cooling IT Rack 102 and Rack Cooler 104. Air-Chilled Cooler 106 receives Heat Exhaust 112 and is rejected to the outside via a fan as shown as 108.

The present invention, which meets the needs identified above, provides for a method and a system for a cooling solution with the current method. The invention is incorporated into the existing containerized data center cooling infrastructure. When conditions outside the container drop below approximately 35° Fahrenheit (F), the present invention can be used to provide all the cooling for the data center and to eliminate the need for the air-cooled chiller. At temperatures between 35° F. and about 55° F., it can be used to provide varying levels of pre-cooling that will help significantly reduce the power and cooling load on the air-cooled chiller.

The present invention provides techniques that can use the surface area of the container for heat transfer to the outside.

Figure 2:
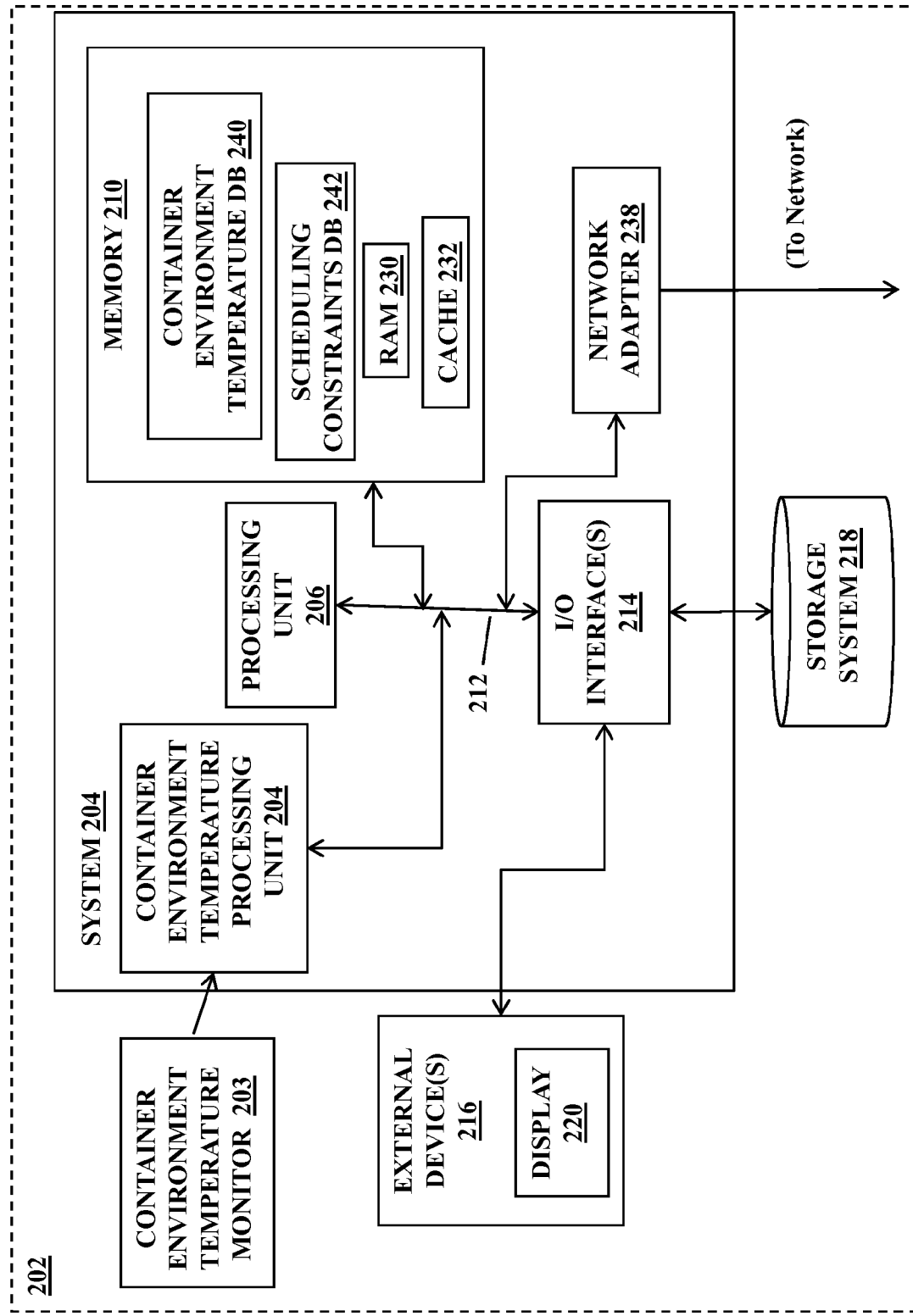
FIG. 2 shows a data processing system suitable for using the surface area of the container for heat transfer to the outside.

System 200 of the present invention, such as Data Processing System 202 shown in FIG. 2, suitable for storing and/or executing program code of the present invention may include at least one processor (Processing Unit 206) coupled directly or indirectly to Memory 210 through System Bus 212. Memory 210 may include local memory (RAM 230) employed during actual execution of the program code and cache memories (Cache 232) that provide temporary storage of at least some program code in order to reduce the number of times code must be retrieved from Bulk Storage 218, connected to Scheduling Constraints Database 242 to store dates and times that may have constraints as for cooling and to Container Environment Temperature DB 240 for collecting temperature of the container environment, during execution. System 200 may further have Container Environment Temperature Monitor 203 for monitoring the temperature of the environment of containerized data centers that is connected to Container Environment Temperature Processing Unit 204 for processing temperature readings in the containerized data centers. Container Environment Temperature Monitor 203 feeds the temperature of the containerized center to Container Environment Temperature Processing Unit 204 that processes the containerized environment temperature. Memory 210 may further include Container Environment Temperature Database 240 that stores the containerized environment temperature. Container Environment Temperature Processing Unit 204 controls the air-chilled cooler so that when conditions outside the container drop below, for example, approximately 35° Fahrenheit (F), all the cooling for the data center can be from the environment, eliminating the need for the air-cooled chiller. At temperatures between 35° F. and about 55° F., Container Environment Temperature Processing Unit 204 can also be used to provide varying levels of pre-cooling that will help significantly reduce the power and cooling load on the air-cooled chiller.

Figure 3:
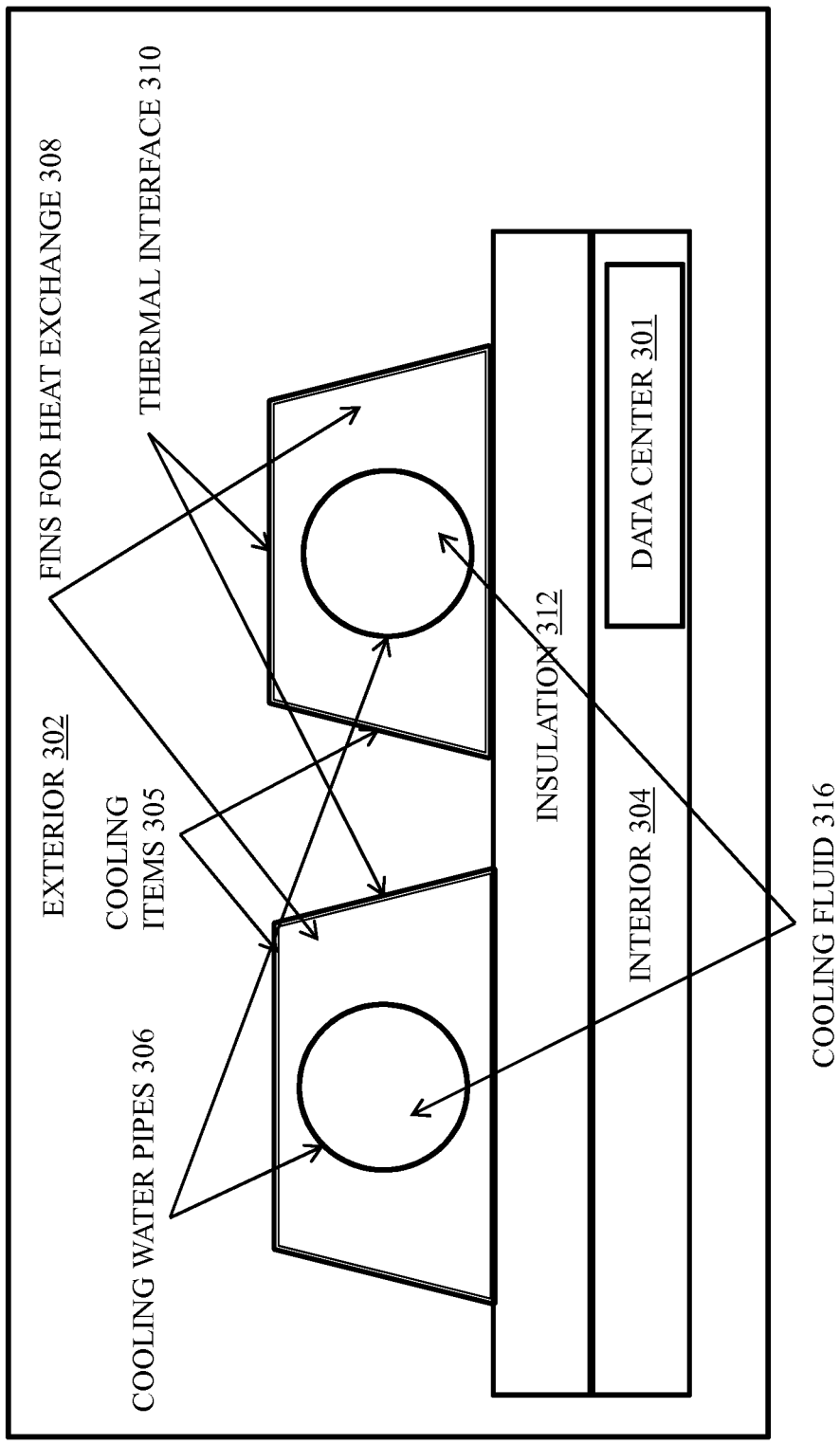
FIG. 3 shows a system for using the surface area of the container for heat transfer to the outside of an embodiment of the present invention.

FIG. 3 illustrates Cross Section Of Container Skin—Heat Exchanger System 300 of the present invention for reducing the container data center's dependency on its air-cooled chiller, relying on outside environmental conditions to provide partial or full cooling at times. It helps reducing the container data center's dependency on its air-cooled chiller, relying on outside environmental conditions to provide partial or full cooling at times. System 300 has Data Center 301, an Exterior 302 and an Interior 304. Insulation 312 provides Interior 304 with protection from heat and cold from Exterior 302 to maintain a stable heat environment for Interior 304. Generally, Interior 304 and Cooling Water Pipes (Run Pipes) 306 will gather heat that needs to be displaced in order for the equipment to operate properly. Located proximately to Insulation 312 are Cooling Items 305 that have Fins for Exchanged Heat Exchange 308 and Cooling Water Pipes (Run Pipes) 306. A shell and tube heat exchanger is a class of heat exchanger designs. It is the most common type of heat exchanger in oil refineries and other large chemical processes, and is suited for higher-pressure applications. As its name implies, this type of heat exchanger consists of a shell (a large pressure vessel—Cooling Water Pipes 306). The cooling water pipes carry the heat from the rack cooler to the corrugated external skin of the container. The heat is then rejected through the corrugated external skin of the container. Thermal Interface 310 transfers the hot temperature to Exterior 302.

Figure 4:
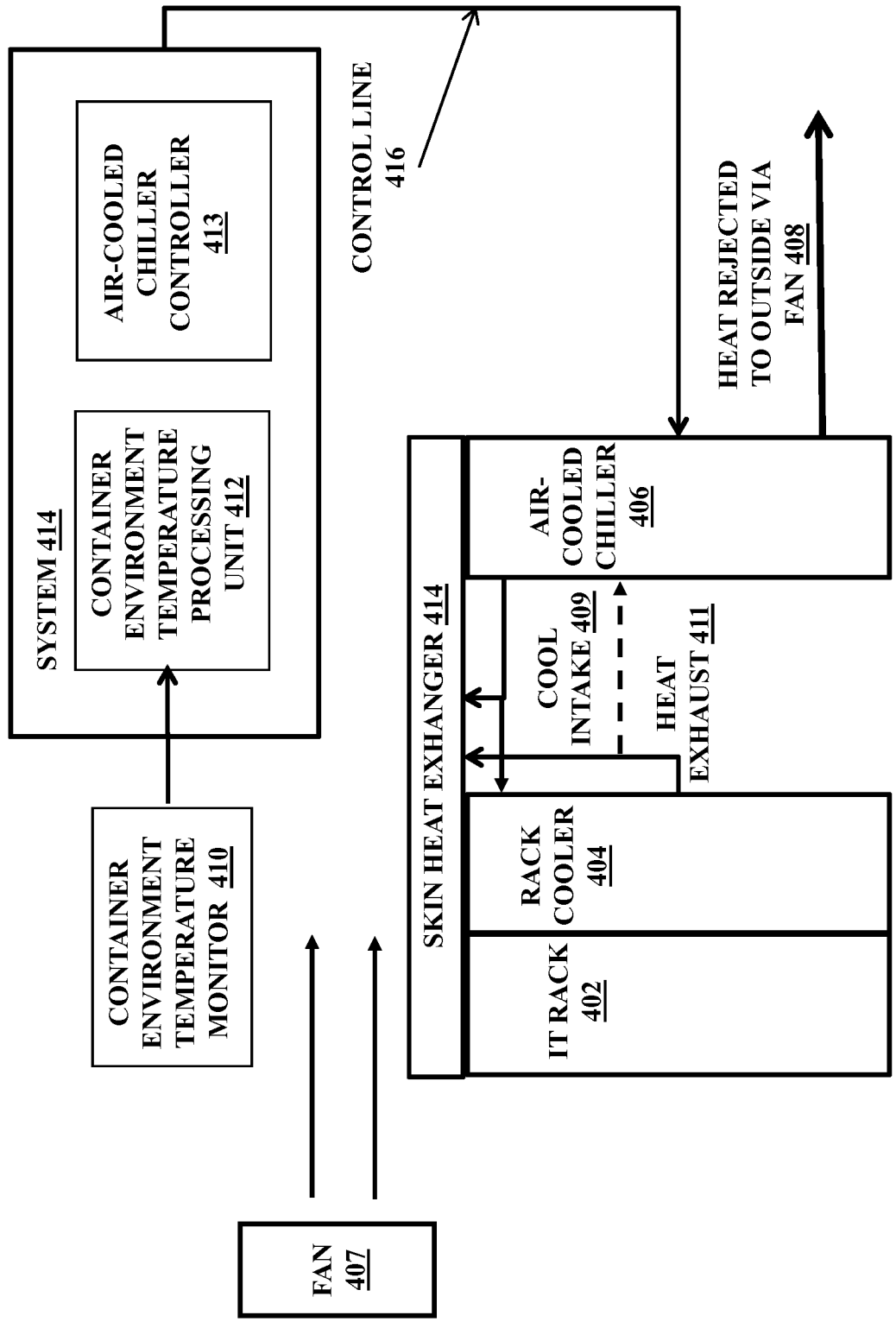
FIG. 4 illustrates a free cooling system mode system of the present invention for using the surface area of the container for heat transfer to the outside.

FIG. 4 is a Free Cooling Mode System 400 of the present invention that has IT Rack 402 attached to Rack Cooler 404. All data center cooling is provided by outside conditions, and, where part of the data center cooling is provided by outside conditions, the remainder of cooling provided by the air cooled chiller. Air-Cooled Chiller 406 provides Cool Intake 409 to Skin Heat Exchanger 414 which also receives Heat Exhaust 411 from Rack Cooler 404. External fan 407 is used to blow cold outside air across skin heat exchanger 414 when in free cooling mode. Skin Heat Exchanger 414 may have fins to remove heat from IT Rack 402. Free Cooling Mode System 400 may further have Container Environment Temperature Monitor 410 that monitors the temperature of the environment of the container data center and feeds that data to Container Environment Temperature Processing Unit 412 in System 414. Container Environment Temperature Processing Unit 412 processes the temperature readings of the environment of the container data center to determine the amount of cooling necessary for the containerized data center. It can control if there is full cooling, partial cooling or no cooling provided by Air-Chilled Cooler 406 by Air-Chilled Cooler Controller 413 via Control Line 416. Heat from IT Rack 402 is exhausted via a fan as shown as 408.

For total free cooling, all rack heat exhaust 411 will flow to skin heat exchanger 414, and no cool intake 409 will flow from air cooled chiller 406 to rack cooler 404. For partial free cooling, rack heat exhaust 411 will split between air cooled chiller 406 and skin heat exchanger 414 and partial cool intake 409 will flow from air cooled chiller 406 to rack cooler 404.

FIG. 5 illustrates method 500 of the present invention for cooling a containerized data center that are designed to operate in remote locations and under extreme conditions without air-cooled chillers for cooling that are less efficient than more conventional, water-cooled chillers. At 502, the temperature of the environment is captured by Container Environment Temperature Monitor 410 (FIG. 4). The temperature of the environment is received at 504 by Container Environment Temperature Processing Unit 412 (FIG. 4). The temperature measurement and cooling control determines whether the outside environment is cold enough to begin using the free cooling mode, and to what extent (partial or full). Container Environment Temperature Processing Unit 412 (FIG. 4) determines whether the temperature warrants increasing the cooling at 506 from Air-Cooled Chiller 406 (FIG. 4). Container Environment Temperature Controller 412 (FIG. 4)

increases the cooling from Air-Cooled Chiller 406 (FIG. 4) if needed at 508. Container Environment Temperature Controller 412 (FIG. 4) determines whether the temperature warrants less cooling at 510 based upon the environmental temperature in the containerized data center. Container Environment Temperature Unit 412 (FIG. 4) decreases the cooling if allowable by the temperature of the environment at 512. Container Environment Temperature Processing Unit 412 (FIG. 4) decreases the cooling from Air-Cooled Chiller 406 (FIG. 4) if allowable by the current environment temperature at 512. Container Environment Temperature Processing Unit 412 (FIG. 4) determines whether any cooling at all is needed at 514 and, at 516, Container Environment Temperature Processing Unit 412 (FIG. 4) turns off Air-Cooled Chiller 406 (FIG. 4) if no cooling is needed based upon the environmental temperature of the of the environment.

It should be understood that the present invention is typically computer-implemented via hardware and/or software. As such, client systems and/or servers will include computerized components as known in the art. Such components typically include (among others) a processing unit, a memory, a bus, input/output (I/O) interfaces, external devices, etc.

While shown and described herein as a system and method for reducing the container data center's dependency on its air-cooled chiller, relying on outside environmental conditions to provide partial or full cooling at times. For example, in one embodiment, the invention provides a computer-readable/useable medium that includes computer program code to enable a system for reducing the container data center's dependency on its air-cooled chiller, relying on outside environmental conditions to provide partial or full cooling at times and for using the system for reducing the container data center's dependency on its air-cooled chiller, relying on outside environmental conditions to provide partial or full cooling at times. To this extent, the computer-readable/useable medium includes program code that implements each of the various process steps of the invention. It is understood that the terms computer-readable medium or computer useable medium comprises one or more of any type of physical embodiment of the program code. In particular, the computer-readable/useable medium can comprise program code embodied on one or more portable storage articles of manufacture (e.g., a compact disc, a magnetic disk, a tape, etc.), on one or more data storage portions of a computing device, such as memory and/or storage system (e.g., a fixed disk, a read-only memory, a random access memory, a cache memory, etc.), and/or as a data signal (e.g., a propagated signal) traveling over a network (e.g., during a wired/wireless electronic distribution of the program code).

In another embodiment, the invention provides a computer-implemented method for reducing the container data center's dependency on its air-cooled chiller, relying on outside environmental conditions to provide partial or full cooling at times. In this case, a computerized infrastructure can be provided and one or more systems for performing the process steps of the invention can be obtained (e.g., created, purchased, used, modified, etc.) and deployed to the computerized infrastructure. To this extent, the deployment of a system can comprise one or more of (1) installing program code on a computing device, such as computer system from a computer-readable medium; (2) adding one or more computing devices to the computer infrastructure; and (3) incorporating and/or modifying one or more existing systems of the computer infrastructure to enable the computerized infrastructure to perform the process steps of the invention.

As used herein, it is understood that the terms "program code" and "computer program code" are synonymous and may mean any expression, in any language, code or notation, of a set of instructions intended to cause a computing device having an information processing capability to perform a particular function either directly before or after either or both of the following: (a) conversion to another language, code or notation; and/or (b) reproduction in a different material form. To this extent, program code can be embodied as one or more of: an application/software program, component software/a library of functions, an operating system, a basic I/O system/driver for a particular computing and/or I/O device, and the like.

In another embodiment, the invention provides a business method that performs the process steps of the invention on a subscription, advertising, and/or fee basis. That is, a service provider, such as a solution integrator, could offer to deploy a computer infrastructure for reducing the container data center's dependency on its air-cooled chiller, relying on outside environmental conditions to provide partial or full cooling at times. In this case, the service provider can create, maintain, and support, etc., the computer infrastructure by integrating computer-readable code into a computing system, wherein the code in combination with the computing system is capable of performing the process steps of the invention for one or more customers. In return, the service provider can receive payment from the customer(s) under a subscription and/or fee agreement and/or the service provider can receive payment from the sale of advertising content to one or more third parties.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A heat exchanger system for removing heat from a containerized data center having an IT container comprising:
   one or more cooling items abutting an outer surface of the IT container, each of the one or more cooling items having an outer thermal transfer surface forming a plurality of fins for heat exchange, and each of the one or more cooling items having a cooling water pipe of cooling fluid located within a recess formed by each of the plurality of fins;
   wherein at least one of the outer surface of the container and the cooling water pipes is composed of metal;
   an insulating material separating the outer surface of the IT container from an inner surface of the IT container;
   a container environment temperature processing unit that receives a temperature of an environment of the IT container; and
   an air-cooled chiller controller operable with the container environment processing unit to control cooling based on the temperature of the environment of the IT container.

2. The heat exchanger system as defined in claim 1 further comprising the cooling fluid flowing through the cooling water pipes.

3. The heat exchanger system as defined in claim 1 further comprising a fan for blowing external cool air past the outer thermal transfer surface.

4. The heat exchanger system as defined in claim 1 further comprising a container environment temperature monitor for monitoring the temperature of the environment surrounding an IT cabinet.

5. The heat exchanger system as defined in claim 4, wherein the container environment temperature processing unit receives temperature readings from the container environment temperature monitor and processes the temperature readings.

6. The heat exchanger system as defined in claim 5, wherein the air cooled chiller controller operable with the container environment temperature processing unit controls an air-cooled chiller by turning it up, down or off based upon a set of controls from the container environment temperature processing unit based upon the temperature of the environment of the IT container.

7. A method for removing heat from a containerized data center having an IT container comprising:
    capturing the temperature of the environment by a container environment temperature monitor;
    receiving the temperature of the environment by a container environment temperature processing unit;
    determining whether the temperature warrants increasing the cooling by the container environment temperature processing unit;
    providing a cooling fluid within a cooling conduit of each of a plurality of cooling items abutting an outer surface of the IT container, wherein each of the one or more cooling items has an outer thermal transfer surface forming a plurality of fins, and wherein the cooling conduit of each of the plurality of cooling items is located within a recess formed by each of the plurality of fins; and
    increasing the cooling if needed by the container environment temperature processing unit and an air-cooled chiller controller.

8. The method as defined in claim 7 further comprising determining whether the temperature warrants a decrease in cooling by the container environment temperature processing unit.

9. The method as defined in claim 8 further comprising decreasing the cooling if warranted by the container environment temperature processing unit and the air-cooled chiller controller.

10. The method as defined in claim 8 further comprising determining whether any cooling is needed by the container environment temperature processing unit.

11. The method as defined in claim 10 further comprising turning off air-cooled chiller if no cooling is needed by the container environment temperature processing unit and the air-cooled chiller controller.

12. A non-transitory computer-readable medium storing computer instructions, which, when executed on a computer processor, enables a system operating for removing heat from a containerized data center having an IT container, to perform steps comprising:
    capturing the temperature of the environment by a container environment temperature monitor;
    receiving the temperature of the environment by a container environment temperature processing unit;
    determining whether the temperature warrants increasing the cooling by the container environment temperature processing unit;
    providing a cooling fluid within a cooling conduit of each of a plurality of cooling items abutting an outer surface of the IT container, wherein each of the one or more cooling items has an outer thermal transfer surface forming a plurality of fins, and wherein the cooling conduit of each of the plurality of cooling items is located within a recess formed by each of the plurality of fins; and
    increasing the cooling if needed by the container environment temperature processing unit and an air-cooled chiller controller.

13. The non-transitory computer-readable medium storing computer instructions as defined in claim 12 wherein the instructions further comprise a step for enabling the system to determine whether the temperature warrants a decrease in cooling by the container environment temperature processing unit.

14. The non-transitory computer-readable medium storing computer instructions as defined in claim 13 wherein the instructions further comprise a step for enabling the system to decrease the cooling if warranted by the container environment temperature processing unit and the air-cooled chiller controller.

15. The non-transitory computer-readable medium storing computer instructions as defined in claim 13 wherein the instructions further comprise a step for enabling the system to determine whether any cooling is needed by the container environment temperature processing unit.

16. The non-transitory computer-readable medium storing computer instructions as defined in claim 15 wherein the instructions further comprise the step for enabling the system to turn off air-cooled chiller if no cooling is needed by the container environment temperature processing unit and the air-cooled chiller controller.

17. A method for deploying a system for removing heat from a containerized data center having an IT container, the method comprising:
    capturing the temperature of the environment by a container environment temperature monitor;
    receiving the temperature of the environment by a container environment temperature processing unit;
    determining whether the temperature warrants increasing the cooling by the container environment temperature processing unit;
    providing a cooling fluid within a cooling conduit of each of a plurality of cooling items abutting an outer surface of the IT container, wherein each of the one or more cooling items has an outer thermal transfer surface forming a plurality of fins, and wherein the cooling conduit of each of the plurality of cooling items is located within a recess formed by each of the plurality of fins; and
    increasing the cooling if needed by the container environment temperature processing unit and an air-cooled chiller controller.

18. The method as defined in claim 17 further comprising enabling the system to determine whether the temperature warrants a decrease in cooling by the container environment temperature processing unit.

19. The method as defined in claim 18 further comprising enabling the system to decrease the cooling if warranted by the container environment temperature processing unit and the air-cooled chiller controller.

20. The method as defined in claim 18 further comprising enabling the system to determine whether any cooling is needed by the container environment temperature processing unit.

* * * * *